United States Patent
Mandai et al.

(10) Patent No.: US 11,940,871 B2
(45) Date of Patent: Mar. 26, 2024

(54) MEMORY SYSTEM AND MEMORY CONTROL METHOD

(71) Applicant: KIOXIA CORPORATION, Tokyo (JP)

(72) Inventors: Yuki Mandai, Tokyo (JP); Shuou Nomura, Yokohama Kanagawa (JP); Ryo Yamaki, Yokohama Kanagawa (JP); Toshikatsu Hida, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 33 days.

(21) Appl. No.: 17/895,465

(22) Filed: Aug. 25, 2022

(65) Prior Publication Data

US 2023/0251928 A1    Aug. 10, 2023

(30) Foreign Application Priority Data

Feb. 10, 2022   (JP) .................. 2022-019335

(51) Int. Cl.
   *G06F 11/10*   (2006.01)
   *G11C 16/08*   (2006.01)
   *G11C 16/26*   (2006.01)

(52) U.S. Cl.
   CPC .......... *G06F 11/1024* (2013.01); *G11C 16/08* (2013.01); *G11C 16/26* (2013.01)

(58) Field of Classification Search
   CPC ....... G11C 16/08; G11C 16/26; G11C 16/028; G11C 16/0483; G11C 29/42; G11C 29/52; G06F 11/1024; G06F 11/1012; G06F 11/1048; G06F 11/1068
   See application file for complete search history.

(56) References Cited

U.S. PATENT DOCUMENTS

| | | | |
|---|---|---|---|
| 10,437,668 B2 | 10/2019 | Takase | |
| 10,783,972 B2 | 9/2020 | Cai et al. | |
| 2016/0259683 A1 | 9/2016 | Sakurada | |
| 2016/0283320 A1* | 9/2016 | Motwani | G06F 11/1012 |
| 2018/0190348 A1* | 7/2018 | Tokutomi | G11C 16/0483 |
| 2018/0253353 A1 | 9/2018 | Takase | |
| 2020/0043557 A1 | 2/2020 | Cai et al. | |
| 2020/0409788 A1* | 12/2020 | Kurose | G11C 16/0483 |
| 2021/0089397 A1 | 3/2021 | Wang et al. | |

* cited by examiner

*Primary Examiner* — Shelly A Chase
(74) *Attorney, Agent, or Firm* — Kim & Stewart LLP

(57) ABSTRACT

A memory system includes a nonvolatile memory including memory cells, and a memory controller. The memory controller is configured to read first data through application of a first read voltage to each of the memory cells, perform a first decoding process with respect to the first data, when the first decoding process fails, perform a tracking process. The tracking process includes reading second data indicating a threshold voltage level of each of the memory cells through application of a plurality of second read voltages to each of the memory cells, and obtaining, with respect to each of the memory cells, likelihood information using the second data. The second read voltages are shifted by a predetermined amount. The memory controller is further configured to perform a second decoding process with respect to the second data using the likelihood information.

20 Claims, 12 Drawing Sheets

FIG. 6

|  | Er | A | B | C | D | E | F | G |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |
| CR | 1 | 1 | 1 | 0 | 0 | 0 | 0 | 0 |
| ER | 1 | 1 | 1 | 1 | 1 | 0 | 0 | 0 |
| Er-A VALLEY: Lower&CR | 1 | 0 | 0 | 0 | 0 | 0 | 0 | 0 |
| A-B VALLEY: Middle&CR | 1 | 1 | 0 | 0 | 0 | 0 | 0 | 0 |
| B-C VALLEY: Upper&ER | 1 | 1 | 1 | 0 | 0 | 0 | 0 | 0 |
| C-D VALLEY: (~Middle | CR)&ER | 1 | 1 | 1 | 1 | 0 | 0 | 0 | 0 |
| D-E VALLEY: (~Lower | CR) | 1 | 1 | 1 | 1 | 1 | 0 | 0 | 0 |
| E-F VALLEY: Middle | ER | 1 | 1 | 1 | 1 | 1 | 1 | 0 | 0 |
| F-G VALLEY: ~Upper |ER | 1 | 1 | 1 | 1 | 1 | 1 | 1 | 0 |

FIG. 11

| DEVIATION AMOUNT | ⟨0⟩ | ⟨1⟩ | ⟨2⟩ | ⟨3⟩ | ⟨4⟩ |
|---|---|---|---|---|---|
| 0 | −11 | −5 | 0 | 5 | 11 |
| 1 | −11 | −5 | 0 | 6 | 12 |
| 2 | −11 | −5 | 1 | 6 | 12 |
| 3 | −10 | −4 | 1 | 6 | 12 |
| 4 | −10 | −4 | 1 | 7 | 13 |
| 5 | −10 | −4 | 2 | 7 | 13 |
| 6 | −9 | −3 | 2 | 7 | 13 |
| 7 | −9 | −3 | 2 | 8 | 13 |
| 8 | −9 | −3 | 3 | 8 | 14 |
| 9 | −9 | −2 | 3 | 8 | 14 |
| 10 | −8 | −2 | 3 | 9 | 15 |
| 11 | −8 | −2 | 4 | 9 | 15 |
| 12 | −8 | −1 | 4 | 9 | 15 |
| 13 | −7 | −1 | 4 | 10 | 16 |
| 14 | −7 | −1 | 5 | 10 | 16 |
| 15 | −7 | 0 | 5 | 10 | 16 |

MEMORY SYSTEM AND MEMORY CONTROL METHOD

CROSS-REFERENCE TO RELATED APPLICATION(S)

This application is based upon and claims the benefit of priority from Japanese Patent Application No. 2022-019335, filed Feb. 10, 2022, the entire contents of which are incorporated herein by reference.

FIELD

Embodiments described herein relate generally to a memory system and a memory control method.

BACKGROUND

In a memory system, data to be stored is encoded into error correction coded data and then stored in the memory system in order to protect the stored data. When the data stored in the memory system is read, decoding is performed on the error correction coded data.

BRIEF DESCRIPTION OF THE DRAWINGS

FIG. 6 is a table to explain an example of level separation.

FIG. 11 is a table illustrating an example of a data structure of a log likelihood ratio (LLR) table.

DETAILED DESCRIPTION

Embodiments provide a memory system and a memory control method capable of shortening a time required for decoding.

In general, according to an embodiment, a memory system includes a nonvolatile memory including a plurality of memory cells and a memory controller. The memory controller is configured to read first data through application of a first read voltage to each of the memory cells, perform a first decoding process with respect to the first data, when the first decoding process fails, perform a tracking process. The tracking process includes reading second data indicating a threshold voltage level of each of the memory cells through application of a plurality of second read voltages to each of the memory cells, the second read voltages being shifted by a predetermined amount, and obtaining, with respect to each of the memory cells, likelihood information indicating a likelihood that the memory cell in the threshold voltage level represents a bit value of 0 or 1 using the second data. The memory controller is further configured to perform a second decoding process with respect to the second data using the likelihood information.

Hereinafter, a memory system and a memory control method according to embodiments will be described with reference to accompanying drawings. Meanwhile, the present disclosure is not limited to the embodiments.

Figure 1:
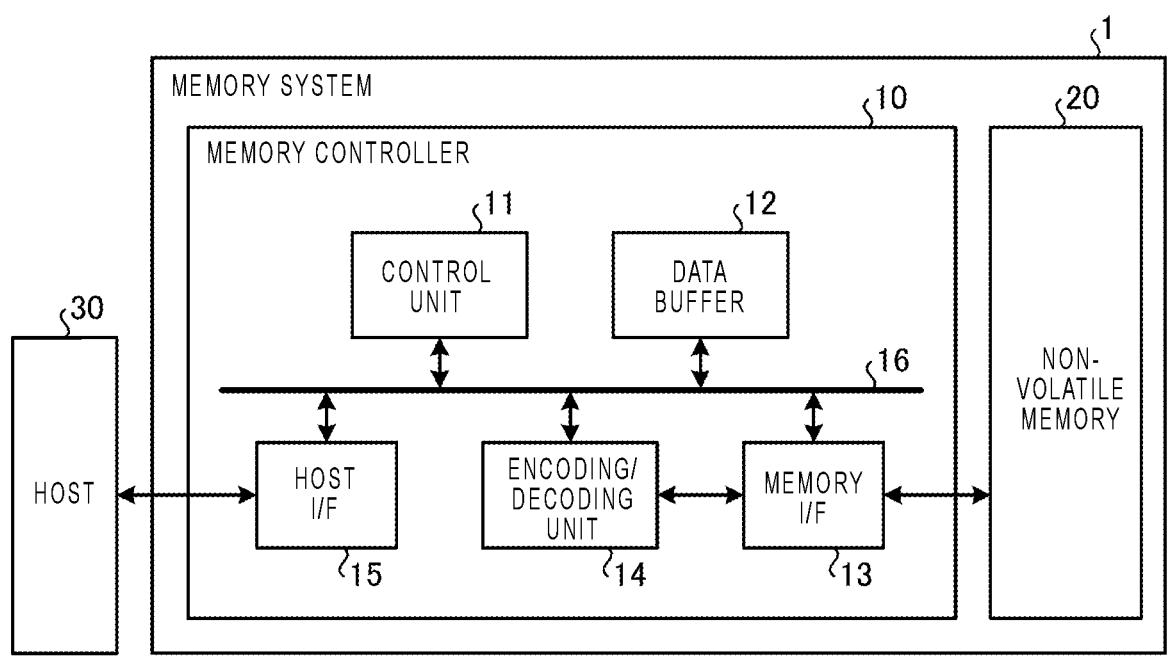
FIG. 1 is a block diagram illustrating an example of a schematic configuration of a memory system according to an embodiment.

First, a memory system according to an embodiment will be described in detail with reference to the drawings. FIG. 1 is a block diagram illustrating an example of a schematic configuration of a memory system according to the embodiment.

As illustrated in FIG. 1, a memory system 1 includes a memory controller 10 and a non-volatile memory 20. The memory system 1 may be connected to a host 30, and FIG. 1 illustrates a state where the memory system 1 is connected to the host 30. The host 30 may be, for example, an electronic device such as a personal computer or a mobile terminal.

The non-volatile memory 20 is a non-volatile memory that stores data non-volatilely, and for example, a NAND flash memory (hereinafter, merely referred to as a NAND memory). In the description below, a case where a NAND memory is used as the non-volatile memory 20 will be described. However, a storage device other than the NAND memory, such as a three dimensional structure flash memory, a resistive random access memory (ReRAM), or a ferroelectric random access memory (FeRAM) may be used as the non-volatile memory 20. Further, it is not necessary that the non-volatile memory 20 is a semiconductor memory, and the embodiment may be applied to various storage media other than the semiconductor memory.

The memory system 1 may be various memory systems including the non-volatile memory 20, such as a so-called a solid state drive (SSD), or a memory card in which the memory controller 10 and the non-volatile memory 20 are configured as one package.

The memory controller 10 controls writing to the non-volatile memory 20 according to a write request from the host 30. Further, the memory controller 10 controls reading from the non-volatile memory 20 according to a read request from the host 30. The memory controller 10 is a semiconductor integrated circuit configured as, for example, a system on a chip (SoC). The memory controller 10 includes a host interface (I/F) 15, a memory interface (I/F) 13, a control unit 11, an encoding/decoding unit (codec) 14, and a data buffer 12. The host I/F 15, the memory I/F 13, the control unit 11, the encoding/decoding unit 14, and the data buffer 12 are connected to each other via an internal bus 16. A part of or an entire operation of each component of the memory controller 10 described below may be implemented by a central processing unit (CPU) performing firmware, or may be implemented by hardware.

The host I/F 15 performs a process in accordance with an interface standard for communication with the host 30, and outputs a command received from the host 30, user data to be written, or the like to the internal bus 16. Further, the host I/F 15 transmits the user data read from the non-volatile memory 20 and restored, a response from the control unit 11, or the like to the host 30.

The memory I/F 13 performs a write process to write data into the non-volatile memory 20 based on an instruction of the control unit 11. Further, the memory I/F 13 performs a read process to read data from the non-volatile memory 20 based on an instruction of the control unit 11.

The data buffer 12 temporarily stores the user data received by the memory controller 10 from the host 30 until the received user data is stored in the non-volatile memory 20. Further, the data buffer 12 temporarily stores the user data read from the non-volatile memory 20 until the read user data is transmitted to the host 30. For example, a general purpose memory such as a static random access memory (SRAM) or a dynamic random access memory (DRAM) may be used as the data buffer 12. The data buffer 12 may be mounted outside the memory controller 10 without being built in the memory controller 10.

The control unit 11 controls respective components of the memory system 1. When a request (may be referred to as a command) is received from the host 30 via the host I/F 15, the control unit 11 performs a control according to the request. For example, the control unit 11 instructs the memory I/F 13 to write user data and parity to the non-volatile memory 20 according to a write request from the host 30. Further, the control unit 11 instructs the memory I/F 13 to read the user data and the parity from the non-volatile memory 20 according to a read request form the host 30.

Further, when the write request to write user data is received from the host 30, the control unit 11 accumulates the user data in the data buffer 12 and determines a data storing area (memory area) on the non-volatile memory 20 for the user data accumulated in the data buffer 12. That is, the control unit 11 manages a write destination of the user data. A correspondence between a logical address of the user data received from the host 30 and a physical address indicating the storing area on the non-volatile memory 20 where the user data is stored is stored as an address conversion table.

When a read request is received from the host 30, the control unit 11 converts a logical address specified by the read request into a physical address using the above described address conversion table, and instructs the memory I/F 13 to read from the physical address.

In the NAND flash memory, in general, writing and reading are performed in a data unit called a page, and erasure is performed in a data unit called a block.

Figure 2:
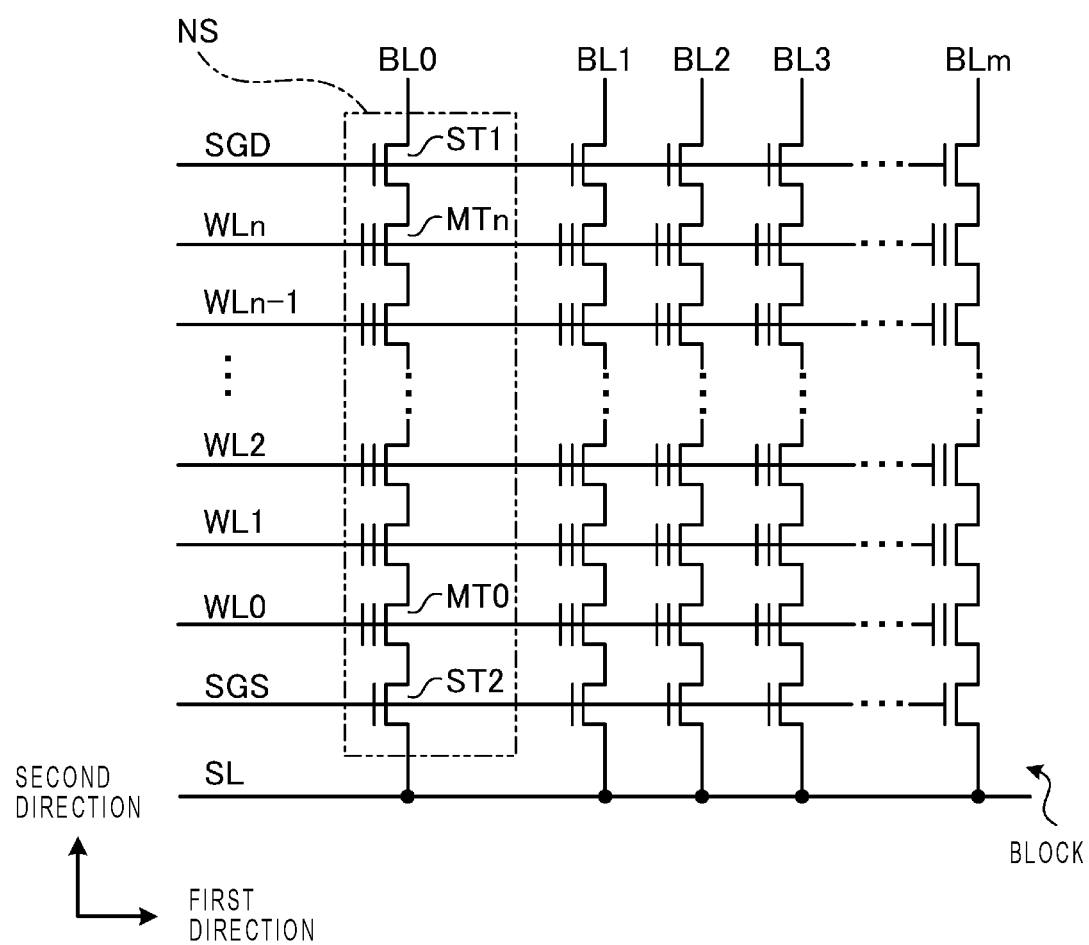
FIG. 2 is a circuit diagram illustrating an example of a configuration of a block.

FIG. 2 is a circuit diagram illustrating an example of a configuration of the block. Each block includes (m+1) NAND strings NS sequentially arranged along a predetermined first direction (m is an integer of 0 or more) The NAND string is also referred to as a memory string. In a select transistor ST1 provided in each of (m+1) NAND strings NS, a drain is connected to bit lines BL0 to BLm, and a gate is commonly connected to a select gate line SGD. In a select transistor ST2, a source is commonly connected to a source line SL, and a gate is commonly connected to a select gate line SGS.

In each NAND string NS, (n+1) memory cell transistors MT are disposed between the source of the select transistor ST1 and the drain of the select transistor ST2 so that the respective current paths are electrically connected in series along a predetermined second direction (n is an integer of 0 or more).

Control gate electrodes of the memory cell transistors MT are connected to word lines WL0 to WLn, respectively, in order from the memory cell transistor MT positioned close to the source side. Therefore, the source of the memory cell transistor MT0 connected to the word line WL0 is connected to the drain of the select transistor ST2, and the drain of the memory cell transistor MTn connected to the word line WLn is connected to the source of the select transistor ST1.

Each of the word lines WL0 to WLn is commonly connected to the control gate electrodes of one memory cell transistor MT in each NAND string NS in the block. That is, the control gate electrodes of the memory cell transistors MT adjacent along the predetermined first direction between the NAND strings NS in the block are connected to the same word line WL. The (m+1) memory cell transistors MT connected to the same word line WL are called as a memory cell group. The memory cell transistor MT is also referred to as a memory cell.

When the memory cell is a single level cell (SLC), one memory cell group corresponds to one page. When the memory cell is a multiple level cell (MLC), one memory cell group corresponds to a plurality of pages. In the present description, the MLC includes a triple level cell (TLC) that stores 3 bits in one memory cell, a quad level cell (QLC) that stores 4 bits in one memory cell, or the like. Further, each memory cell may be identified by an address that identifies the word line and an address that identifies the bit line.

When data is read from the non-volatile memory 20, a read voltage is applied to a word line connected to the memory cell from which data is read, which is the read target, and a predetermined voltage (VREAD) is applied to the other word lines. The VREAD is a voltage that turns on the corresponding memory cell regardless of the data stored in the memory cell.

The user data transmitted from the host 30 is transferred to the internal bus 16 and temporarily stored in the data buffer 12. The encoding/decoding unit 14 encodes the user data into a code word and stores the code word in the non-volatile memory 20. Further, the encoding/decoding unit 14 decodes the code word (may be referred to as a received word) read from the non-volatile memory 20 to restore the user data. The data encoded by the encoding/decoding unit 14 may include control data or the like that is used inside the memory controller 10 in addition to the user data.

Next, details of a decoding process of the code word will be described. As a decoding technique of an error correction code (ECC), there are hard bit decoding (may be referred to as hard decision decoding) and soft bit decoding (may be referred to as soft decision decoding). In the hard bit decoding, an input value is 1 bit (hard bit) of 0 or 1. In contrast, in the soft bit decoding, the input value is likelihood information such as a log likelihood ratio (LLR) indicating the certainty of 0 or 1. The LLR is indicated by a numerical value in a range of, for example, −127 (high probability of being 0) to 127 (high probability of being 1).

Next, the reading of the data from the non-volatile memory 20 will be further described. As described above, memory cells of the non-volatile memory 20 may store data corresponding to one page (in the case of single level cell (SLC) configuration), or a plurality of pages (in the case of multi-level cell (MLC) configuration). Hereinafter, reading data of one page from memory cells is referred to as page read. In the page read, a read result (read data) indicating whether the data in the page, which is the read target, is 0 or 1 for each memory cell constituting the page.

Figure 3:
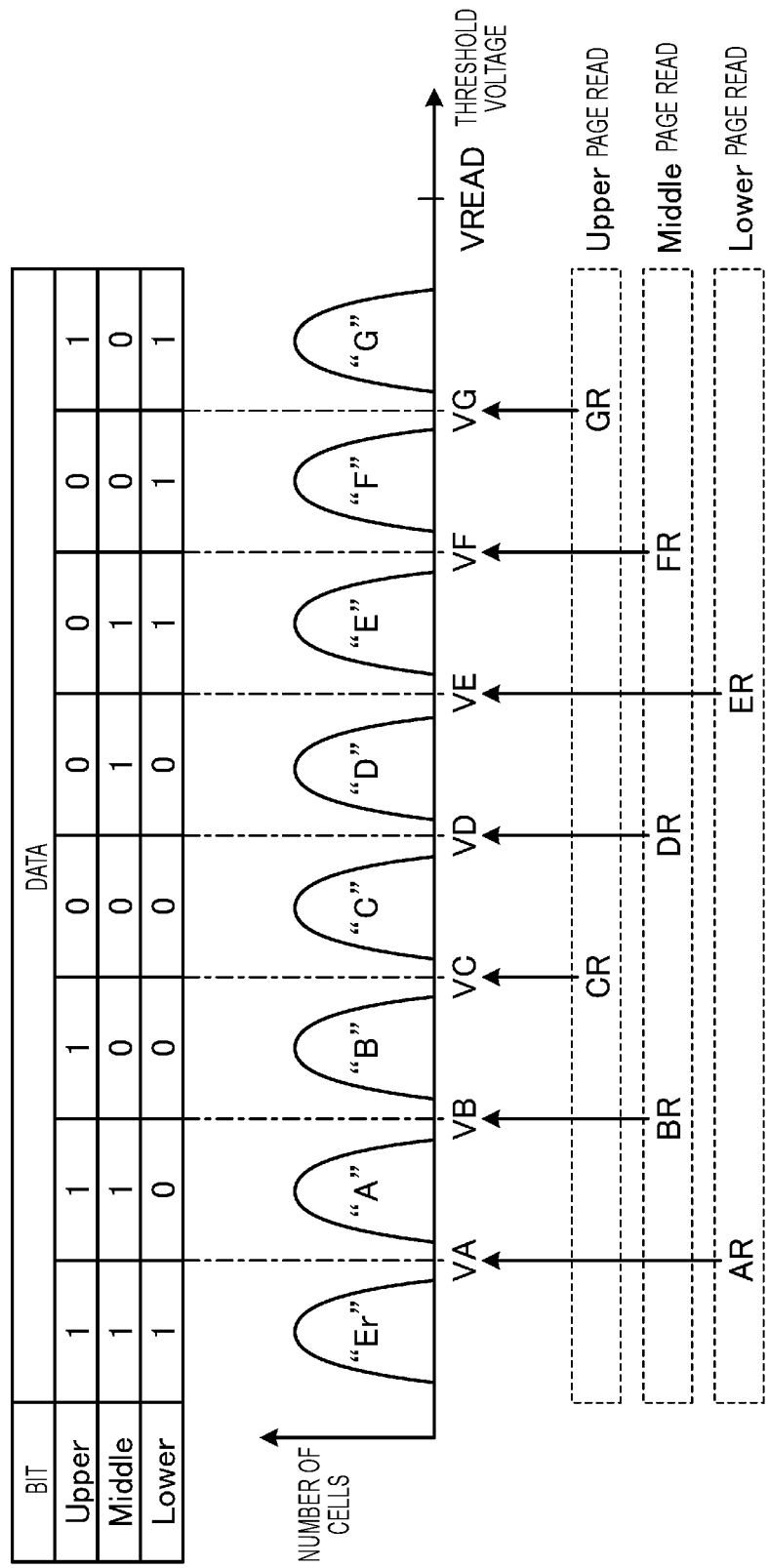
FIG. 3 is a diagram to explain a specific example of page read.

FIG. 3 is a diagram to explain a specific example of the page read. FIG. 3 illustrates an example of data coding and the page read in a triple level cell (TLC) configuration. In the TLC configuration, data of 3 bits stored in one memory cell is called, for example, an upper bit, a middle bit, and a lower bit.

The middle part of FIG. 3 illustrates a distribution of a threshold voltage (hereinafter, referred to as a threshold voltage distribution) of the memory cell in which 3 bits of data are stored in one memory cell. The horizontal axis represents the threshold voltage, and the vertical axis represents the number of memory cells, that is, the bit count.

The set of the upper bits of all memory cells connected to the same word line is called an upper page. The set of the middle bits of all memory cells connected to the same word line is called a middle page. The set of the lower bits of all memory cells connected to the same word line is called a lower page.

As illustrated in the middle part of FIG. 3, in the case of the TLC configuration, the range in which the threshold voltage may be taken is divided into eight sub-ranges. The eight sub-ranges are called an "Er" state, an "A" state, a "B" state, a "C" stage, a "D" state, an "E" state, an "F" state, and a "G" state, in the incremental order of the threshold voltage. Each state corresponds to information indicating the magnitude of the threshold voltage.

In the page read, reading is performed using a plurality of read voltages predetermined for each page, and it is specified whether the upper bit, the middle bit, and the lower bit in each cell is 0 or 1 from a read results of reading by the plurality of read voltages. In the example in FIG. 3, two read voltages of VA and VE are used in a case of the page read targeting the lower page (may be referred to as lower page read). Three read voltages of VB, VD, and VF are used in a case of the page read targeting the middle page (may be referred to as middle page read). Two read voltages of VC and VG are used in a case of the page read targeting the upper page (may be referred to as upper page read).

In the reading by each read voltage, a read result (read data) of 1 bit indicating whether or not the threshold voltage of the memory cell is larger than the read voltage is obtained. For example, when the threshold voltage is larger than the read voltage, the read data indicating 0 is obtained. Further, when the threshold voltage is smaller than the read voltage, the read data indicating 1 is obtained. Hereinafter, the process to obtain the information indicating the magnitude of the threshold voltage with respect to one read voltage as described above is referred to as a single-state read.

In the page read, it is specified whether the upper, middle, and lower bits of each memory cell is 0 or 1 from the read data obtained by a plurality of single state reads. AR to GR in the bottom of FIG. 3 indicate two single state reads using the read voltages VA to VG. In the example in FIG. 3, it is assumed that the results of reading the lower bit with the two read voltages of VA and VE are 0 and 1, respectively. In this case, it may be specified that the threshold voltage of the memory cell is greater than VA and smaller than VE, that is, the lower bit is 0.

In the same manner, it is specified whether each of the middle bit and the upper bit is 0 or 1. From the values of the upper, middle, and lower bits, it may be specified that to which state the memory cell corresponds to.

A plurality of reads required to specify the value of the upper, middle, or lower bit of each memory cell is referred to as boundary reads required for the page. For example, AR and ER are performed as the boundary reads for specifying the lower page.

The threshold voltage distribution in memory cells illustrated in FIG. 3 may be changed in accordance with the elapse of time, or for each access.

Figure 4:
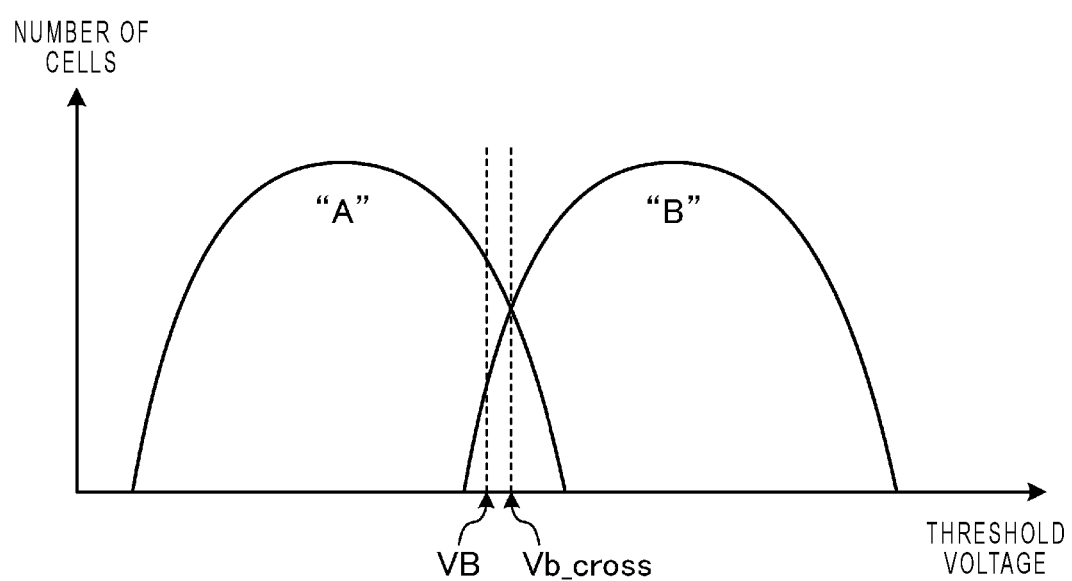
FIG. 4 is a diagram illustrating an example of a threshold voltage distribution after a change.

FIG. 4 is a diagram illustrating an example of the threshold voltage distribution after a change. For simplicity of the description, FIG. 4 only illustrates the "A" state and the "B" state. The base of the threshold voltage distribution in the "A" state and the base of the threshold voltage distribution in the "B" state are overlapped with each other. In other words, the maximum value of the "A" state exceeds the read voltage VB, and the minimum value of the "B" state is below the read voltage VB. When a memory cell having the threshold voltage that belongs to the "A" state and is larger than the read voltage VB is read, the threshold voltage of the memory cell is recognized as belonging to the "B" state. That is, the data programmed as "110" is read as "100". When a memory cell having the threshold voltage that belongs to the "B" state and is smaller than the read voltage VB is read, the threshold voltage of the memory cell is recognized as belonging to the "A" state. That is, the data programmed as "100" is read as "110". The data changed at the time of programming is detected as an error by the encoding/decoding unit 14, and correction is attempted.

However, there is a limit to the correction capability of the encoding/decoding unit 14. The memory controller 10 may shift the read voltage used in the boundary read in order to minimize the number of bits detected as an error (hereinafter, the number of errors) as much as possible. The memory controller 10 estimates the value of the read voltage that minimizes the number of errors for each read voltage used in the boundary read. The process that estimates the read voltage that minimizes the number of errors is referred to as a track process. Further, the read voltage that minimizes the number of errors is referred to as an optimum read voltage.

In the track process, for example, the read operation is performed a plurality of times while shifting the read voltage by a predetermined step size to generate a histogram. The histogram indicates the number of memory cells for each threshold voltage range among a plurality of memory cells provided in the page, and the position of the valley in the generated histogram is estimated as the optimum read voltage.

In FIG. 4, when a voltage Vb_cross at the intersection of the threshold voltage distribution in the "A" state and the threshold voltage distribution in the "B" state is used as the read voltage, a total of the number of errors in which the data "110" is read as the data "100" and the number of errors in which the data "100" is read as the data "110" becomes a minimum. That is, the voltage Vb_cross is the optimum read voltage of BR.

The memory controller 10 may estimate an optimum read voltage, and instruct the non-volatile memory 20 to read using the estimated optimum read voltage. The estimated optimum read voltage may not necessarily coincide with an actual optimum read voltage. The non-volatile memory 20 performs the read operation on the memory cell using the estimated optimum read voltage set by the memory controller 10. Hereinafter, unless otherwise specified, the estimated optimum read voltage is simply referred to as an optimum read voltage. Further, a read operation performed by shifting a read voltage used in the boundary read is referred to as "shift read".

The memory controller 10 may perform the track process at any timing. As an example of the embodiment, the memory controller 10 performs the track process when the encoding/decoding unit 14 fails in error correction.

The optimum read voltage obtained in the track process is stored as a history value in, for example, the data buffer 12, and may be used in a subsequent read operation. Hereinafter, the read operation using the history value stored in the data buffer 12 or the like as the read voltage may be referred to as a history value read. The history value may be stored in any unit, for example, one page unit or a plurality of page units.

Details of the track process will be described with reference to FIGS. 5 to 7. The track process is performed for, for example, each page. Hereinafter, the track process that estimates the optimum values of the read voltages VB, VD, and VF used in the read operation of the middle page (hereinafter, referred to as a middle track process) will be described as an example.

In the middle track process, the shift read is performed a plurality of times while changing (shifting) the read voltage. Each shift read performed during the middle track process is the same as the page read targeting the middle page, specifically, the process of determining the value of the middle bit by performing the single state reads BR, DR, and FR. In each shift read, the read voltages VB, VD, and VF are shifted, respectively.

Figure 5:
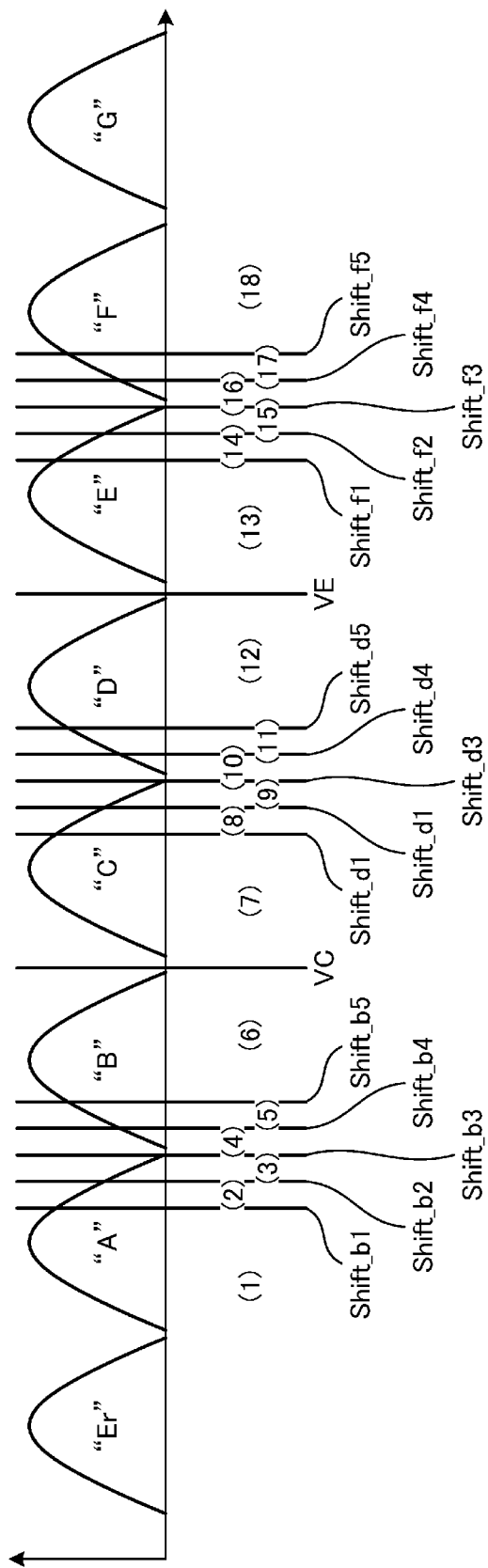
FIG. 5 is a diagram illustrating each read voltage used in a track process.

FIG. 5 is a diagram illustrating each read voltage used in the middle track process. In the example in FIG. 5, the shift read is performed five times using the read voltages at five points. The number of times of the shift read is not limited to five, but may be four or six or more. Hereinafter, the shift read of j times using the read voltage at j points (j is an integer of 4 or more) may be referred to as a j-point shift read. In each shift read, Shift_bx is used as the read voltage VB, Shift_dx is used as the read voltage VD, and Shift_fx is used as the read voltage VF where x is an integer of 1 to 5.

Hereinafter, the valley between the threshold voltage distribution in the "Er" state and the threshold voltage distribution of the "A" state is referred to as an Er-A valley. In the same manner, the valleys between the threshold voltage distributions of other adjacent states are referred to as follow.

Between "A" state and "B" state: A-B valley
Between "B" state and "C" state: B-C valley
Between "C" state and "D" state: C-D valley
Between "D" state and "E" state: D-E valley
Between "E" state and "F" state: E-F valley
Between "F" state and "G" state: F-G valley In the present embodiment, in the shift read of one time as an example, each of the read voltages VB, VD, and VF is shifted by the same amount from the reference values of the read voltages VB, VD, and VF. Hereinafter, unless otherwise specified, the shift amount represents the shift amount from the reference value. Further, the intervals of the shift amount applied to the j-point shift read are assumed to be equal intervals.

In the middle track process, in addition to the shift read, a read operation for acquiring mask data is performed. The read data of the shift read is generated by arithmetic using the read results of a plurality of single state reads. The mask data is used to separate the read results of the single state reads into multiple groups. The read operation for acquiring the mask data is referred to mask data read. The process that separates the read results is also called as level separation. The level separation may also be interpreted as a process that specifies which valley the read data of the shift read corresponds to.

In the mask data read, a specific voltage is applied to the target word line WL. The specific voltage is, for example, a voltage between the optimum read voltages of two estimation targets adjacent to each other. For example, a voltage that is sufficiently far from the optimum read voltages between two estimation targets adjacent to each other is adopted as the specific voltage. In other words, a voltage set between the read voltage of any one of the three read voltages VB, VD, and VF for determining the middle bit, and the read voltage that is the second largest among the read voltages is adopted as the specified voltage.

In the middle page read, the read voltages VB, VD, and VF are used. Therefore, in the middle track process, in an example, CR and ER (i.e., reading with the read voltages VC and VE) are performed as the mask data read. That is, the read result of CR and the read result of ER are used as the mask data.

In the middle track process, the range where the threshold voltage of each memory cell may exist is divided into a total of 18 sections ((1) to (18) in FIG. 5) by each read voltage used in the five-point shift read, the read voltage VC used in CR, and the read voltage VE used in ER.

For example, when the read result of CR in a certain memory cell is "1 (memory cell is in ON state)", it indicates that the threshold voltage of the memory cell is included in the sections (1) to (6). When the read result of CR in a certain memory cell is "0 (memory cell is in OFF state)", it indicates that the threshold voltage of the memory cell is not included in the sections (1) to (6). That is, by masking the read data of the five-point shift read using the read result of CR, it is possible to separate the memory cells having the threshold voltage included in the sections (1) to (6) and the memory cells having the threshold voltage that is not included in the sections (1) to (6) from each other.

In the sections (1) to (6), it is determined whether the read data by the shift read is "1" or not only from the read result of BR. When the read result of BR is "1 (i.e., memory cell is in ON state)", the read data becomes "1". When the read result of BR is "0 (i.e., memory cell is in OFF state)", the read data becomes "0".

Therefore, in the example, by performing a logical product (AND) arithmetic with the read result of CR and each read data obtained by each shift read, the read result of BR may be acquired from the read data obtained by each shift read.

The read result may be acquired with respect to the sections (7) to (12) and the sections (13) to (18) in the same manner.

FIG. 6 is a table to explain an example of the level separation. In the example in FIG. 6, CR and ER are performed as the mask data read as described above. "Upper", "Middle", and "Lower" indicate the read data of the shift reads in the upper page, the middle page, and the lower page, respectively. "CR" and "ER" indicate the read data by CR and ER, respectively.

Sixth to twelfth rows indicate examples of the arithmetic for specifying a valley. For example, "Lower&CR", which is the arithmetic in the sixth row, may specify that the read data in the lower page is the data corresponding to the Er-A valley.

Hereinafter, each read result separated from the read data of the shift read by using the mask data is referred to as separated data. Further, the voltage used as the read voltage in the shift read may be referred to as a shift read voltage.

A plurality of memory cells belonging to the target word line WL is classified into an individual section based on each separated data for each shift read. Then, the number of memory cells classified into each individual section is counted. Specifically, the count for each section is performed as follow. That is, the memory cells having different values are counted between two separated data obtained by the shift reads of two times performed using the shift read voltage on both sides of any section. The result obtained by the count corresponds to the number of memory cells classified by the section.

For example, the number of "1 (i.e., memory cell is in ON state)" included in each of the separated data obtained by the shift read using Shift_bi, and the separated data obtained by the shift read using Shift_b(i+1) is counted. This process corresponds to the counting each of Count_bi, which is the number of the memory cells that are turned on when Shift_bi is used as the read voltage, and Count_b(i+1), which is the number of memory cells that are turned on when Shift_b (i+1) is used as the read voltage. After the counting, a difference between Count_bi and Count_b(i+1) is calculated. The calculated difference corresponds to the number of memory cells classified into the section between Shift_bi and Shift_b(i+1). Alternatively, the number of memory cells in OFF state may be counted.

As a result, a histogram indicating the number of memory cells for each section of the threshold voltage range is completed.

Figure 7:
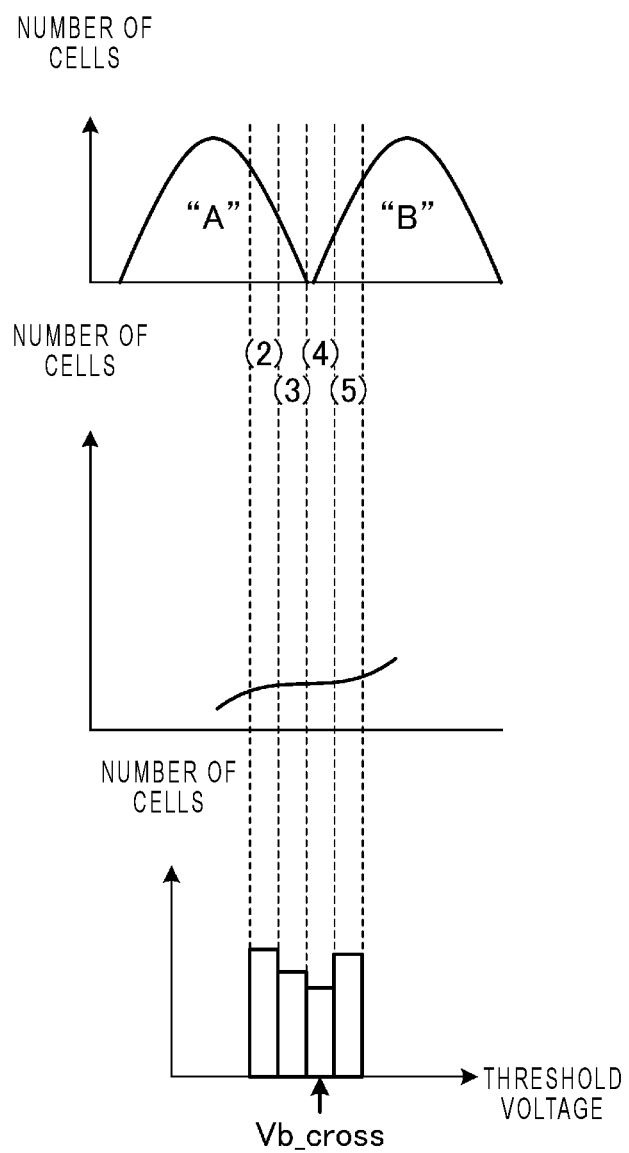
FIG. 7 is a diagram illustrating an example of a histogram generated in a track process.

FIG. 7 is a diagram illustrating an example of a histogram generated through the track process. The upper graph in FIG. 7 is a graph illustrating the threshold voltage distribution. The middle graph in FIG. 7 is a graph illustrating the number of memory cells in ON state when each shift read voltage is applied. The lower graph in IFG. 7 is a histogram.

Although only the example of the histogram with respect to the read voltage VB is illustrated in FIG. 7, a histogram is generated for each of the read voltages VB, VD, and VF in the middle track process. In each histogram, the optimum read voltage is individually estimated from the section where the number of memory cells is the minimum value. For example, the estimated optimum read voltage is calculated by an internal section ratio of the memory cell counts of two sections adjacent to the section where the frequency is the minimum value. The method for calculating the optimum read voltage is not limited thereto.

When the track process is performed to specify the position of the valley with a granularity smaller than a shift amount ΔR of the read voltage, there may be a positional difference (deviation amount) between the calculated optimum read voltage and its adjacent shift read voltage. For example, when the optimum read voltage is indicated by a digital to analogue converter (DAC) value, and the shift amount ΔR applied to the shift read in the track process is corresponding to αDAC value (α is an integer of 2 or more), a deviation amount of 0DAC value to (α−1)DAC value may occur. 0DAC value indicates a deviation amount when there is no deviation amount. For example, when α=16 (ΔR=16DAC value), the deviation amount may take 16 values from 0 to 15. The shift read voltages of a plurality of shift read voltages closer to the position of the valley than other shift read voltages is used as the shift read voltage serving as a reference for the deviation. For example, a predetermined one of the shift read voltages on both sides of the section is used as the shift read voltage serving as a reference for the deviation.

Here, an outline of the decoding process performed by the memory system 1 according to the present embodiment will be described. The memory system 1 first performs a decoding process DecA with respect to data read through the history value read or the normal read. The normal read is, for example, page read using a reference value of a read voltage (an example of the first read voltage) preset as a read voltage applied to the word line at the time of reading. For example, when the history value is not stored, the normal read using the reference value of the read voltage is performed.

When the decoding process DecA fails, the memory system 1 performs a decoding process DecB, which is more accurate. The decoding process DecB includes the track process, and soft bit decoding that obtains the likelihood information (LLR) with respect to the data read through the track process and uses the obtained LLR. When the track process in which the deviation amount occurs as described above is performed, the memory system 1 is configured to perform soft bit decoding according to the deviation amount.

The decoding process DecB is also referred to as a decoding process using the data obtained through the track process. Hereinafter, details of the read process performed by the memory system 1 according to the present embodiment, including the decoding process using the data obtained through the track process, will be described.

Figure 8:
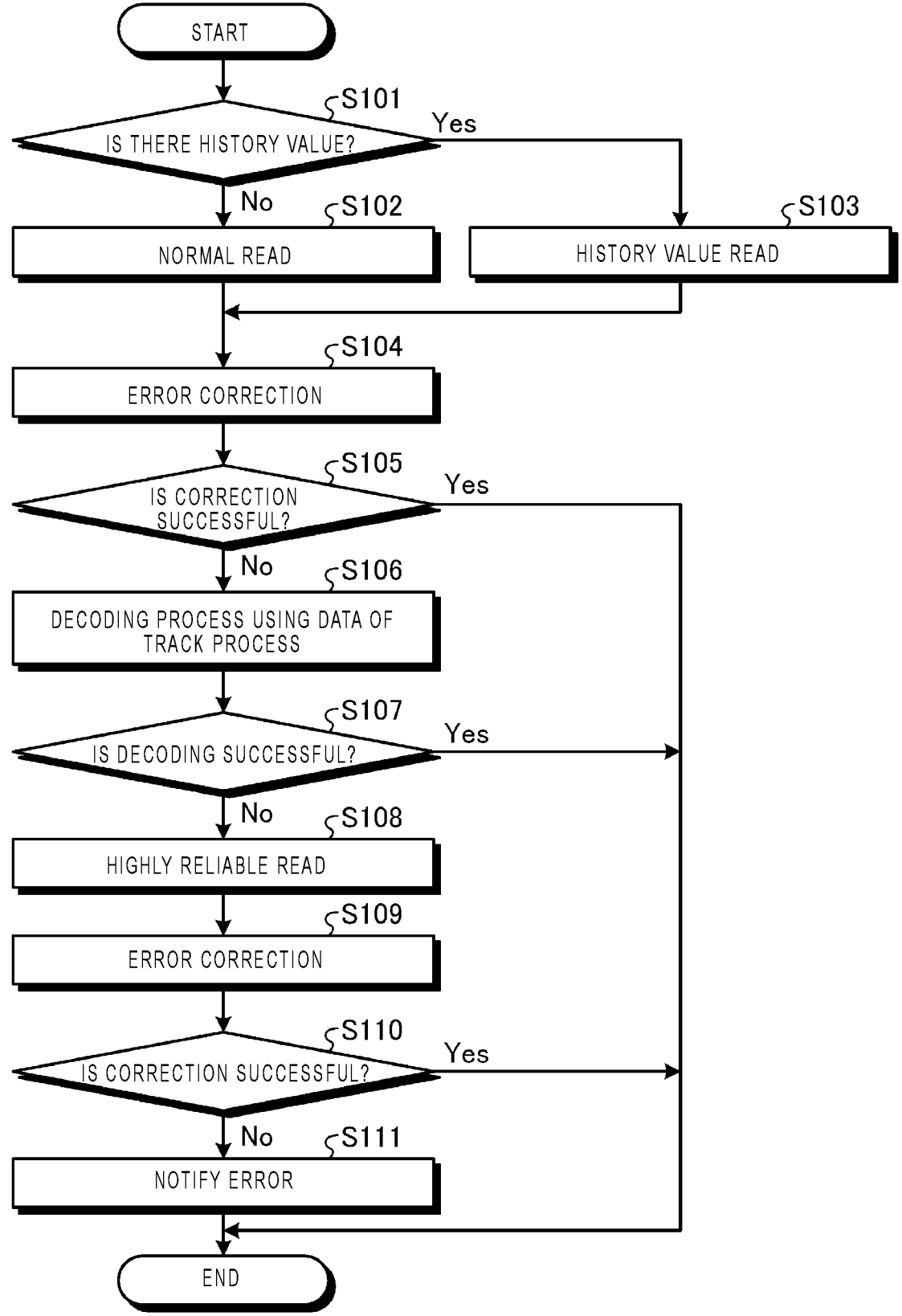
FIG. 8 is a flowchart of a read process by a memory system.

FIG. 8 is a flowchart illustrating an example of the read process performed by the memory system 1. The read process illustrated in FIG. 8 is performed, for example, when a read request is received from the host 30, and when an event such as patrol read or garbage collection (may be referred to as compaction) is performed.

The control unit 11 determines, whether or not the history value is stored for a page corresponding to a word line specified by a physical address (hereinafter, referred to as a target address) of the read target (step S101).

When the history value is not stored (No in step S101), the control unit 11 instructs the memory I/F 13 to read data from the target address of the non-volatile memory 20 by the normal read. In response, the memory I/F 13 performs the normal read (step S102).

When the history value is stored (Yes in step S101), the control unit 11 instructs the memory I/F 13 to read data from the target address of the non-volatile memory 20 by the history value read. In response, the memory I/F 13 performs the history value read (step S103).

The read data obtained through the normal read or the history value read is input to the encoding/decoding unit 14. The encoding/decoding unit 14 performs error correction with respect to the read data (step S104). The control unit 11 determines whether or not the error correction is successful (step S105).

When the error correction fails (No in step S105), the encoding/decoding unit 14 performs the decoding process DecB, which is the decoding process using the data obtained through the track process (step S106). Details of the decoding process DecB will be described below.

The control unit 11 determines whether or not the decoding process DecB is successful (step S107). When the decoding fails (No in step S107), the control unit 11 performs a highly reliable read operation, which is a more reliable read operation (step S108). The highly reliable read operation may be any read operation as long as it is more reliable than the decoding process DecA and the decoding process DecB.

The encoding/decoding unit 14 performs error correction using read data obtained through the highly reliable read operation (step S109). The control unit 11 determines whether or not the error correction is successful (step S110).

When the error correction fails (no in step S110), the control unit 11 notifies the host 30 of a read error (step S111). Thereafter, the read process ends.

When it is determined that the error correction is successful in step S105 and step S110, or when it is determined that the decoding is successful in step S107 (Yes in step S105, Yes in step S107, and Yes in step S110), that is, when it is possible to restore the user data by the encoding/decoding unit 14, the restored user data is output to, for example, the data buffer 12, and then, the read process ends.

Figure 9:
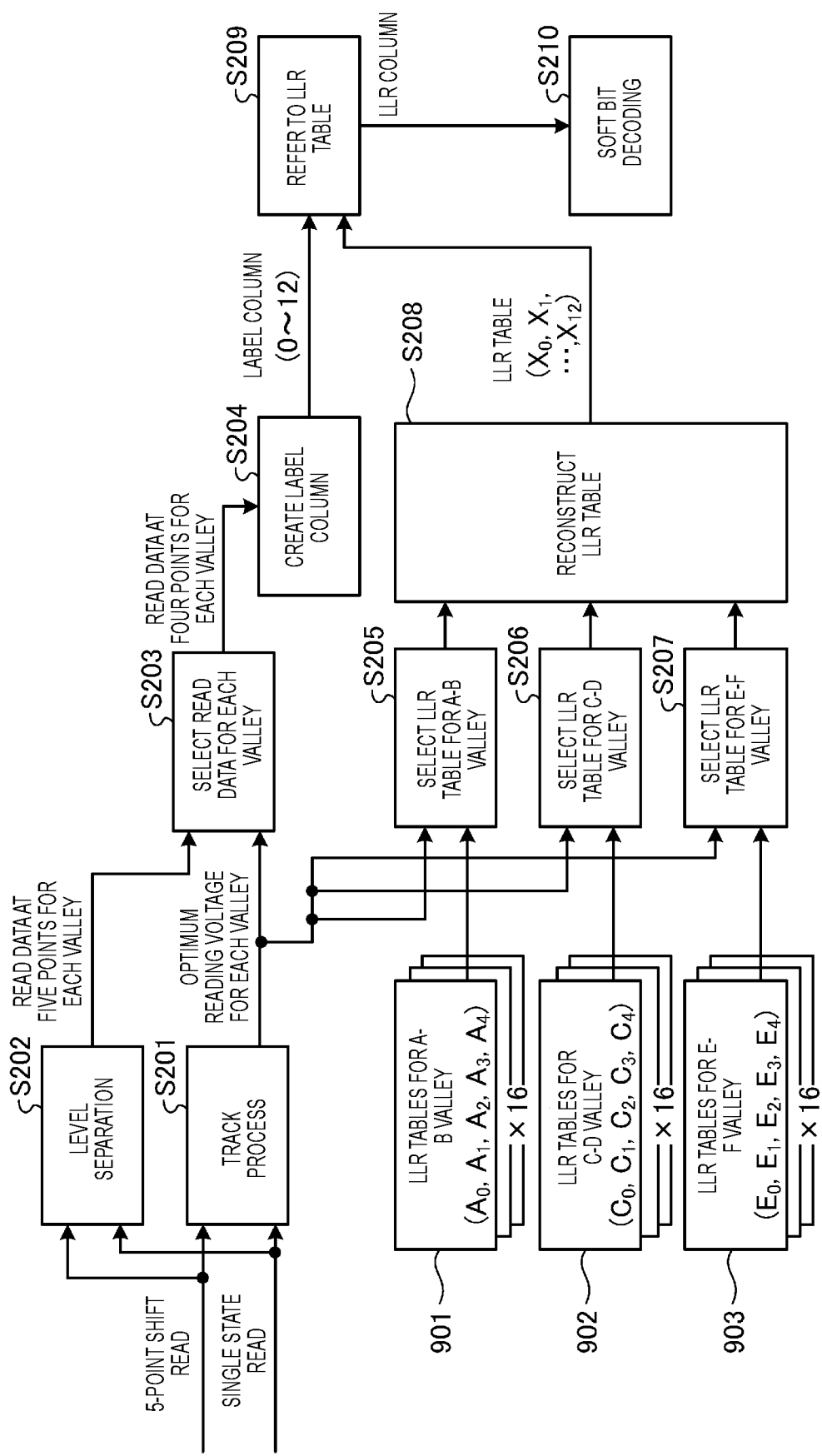
FIG. 9 is a block diagram to explain a flow of a decoding process using data generated by a track process.

As described above, the optimum read voltage obtained through the track process is stored in the data buffer 12 or the like as the history value, and may be used in a subsequent read operation. In an alternative implementation, it may be configured that the history value read is not performed. In the read process in this case, for example, step S101 and step S103 in FIG. 9 are not performed, and the process after the normal read (step 102) is performed.

Next, details of the decoding process (i.e., decoding process DecB) in step S106 using the data obtained through the track process will be described. FIG. 9 is a block diagram to explain a flow of the decoding process using the data obtained through the track process, performed by the memory system 1 according to the present embodiment.

Hereinafter, a case where the track process using five-point shift read will be described as an example. Further, hereinafter, a case where the middle page is read will be described as an example. The same order may be applied to a decoding process using data obtained through a track process including the shift read of four times or six or more times, and the data of another page (lower page or upper page).

First, the encoding/decoding unit 14 performs the track process (i.e., middle track process) (step S201). In the middle track process, the read results of the five-point shift read and the master data read for level separation are obtained, and then the optimum read voltage is obtained for each valley.

As illustrated in FIG. 5, the five-point shift read is performed using five read voltages for each valley. For example, for the A-B valley, the five read voltages of Shift_b1 to Shift_b5 are used.

The encoding/decoding unit 14 performs the level separation for separating the read data of the shift read for each valley (step S202), and obtains read data at five points for each valley. When a process corresponding to step S202 is performed in the track process (step S201), step S202 may be omitted.

The encoding/decoding unit 14 selects read data at four points from the read data at five points for each valley, with reference to the optimum read voltage obtained in the track process (step S203). For example, the encoding/decoding unit 14 specifies read voltages at four points among the read voltages at five points in the order of proximity to the optimum read voltage. Then, the encoding/decoding unit 14 selects read data at four points that are obtained by reading with the specified read voltages at four points.

For the selection of the read data, a case where the histogram as illustrated in the lower part of FIG. 7 is obtained in the track process for the A-B valley will be described as an example. In this example, the optimum read voltage Vb_cross is included in the section (4) among the four sections (2) to (5) divided by Shift_b1 to Shift_b5. In this case, the encoding/decoding unit 14 specifies Shift_b2 to Shift_b5, which are the four read voltages close to the optimum read voltage Vb_cross, among Shift_b1 to Shift_b5. Then, the encoding/decoding unit 14 selects the read data at four points read with Shift_b2 to Shift_b5.

If the optimum read voltage Vb_cross is included in the section (5), the encoding/decoding unit 14 specifies Shift_b2 to Shift_b5, which are the four read voltages close to the optimum read voltage Vb_cross, among Shift_b1 to Shift_b5. Then, the encoding/decoding unit 14 selects the read data at four points read with Shift_b2 to Shift_b5.

If the optimum read voltage Vb_cross is included in the section (2) or in the section (3), the encoding/decoding unit 14 specifies Shift_b1 to Shift_b4, which are the four read voltages close to the optimum read voltage Vb_cross, among Shift_b1 to Shift_b5. Then, the encoding/decoding unit 14 selects the read data at four points read with Shift_b1 to Shift_b4.

The encoding/decoding unit 14 creates a label column using the read data at the selected four points (step S204). The label column is a column of a plurality of labels specified when the LLR is obtained using the LLR table (which is an example of the likelihood table).

Figure 10:
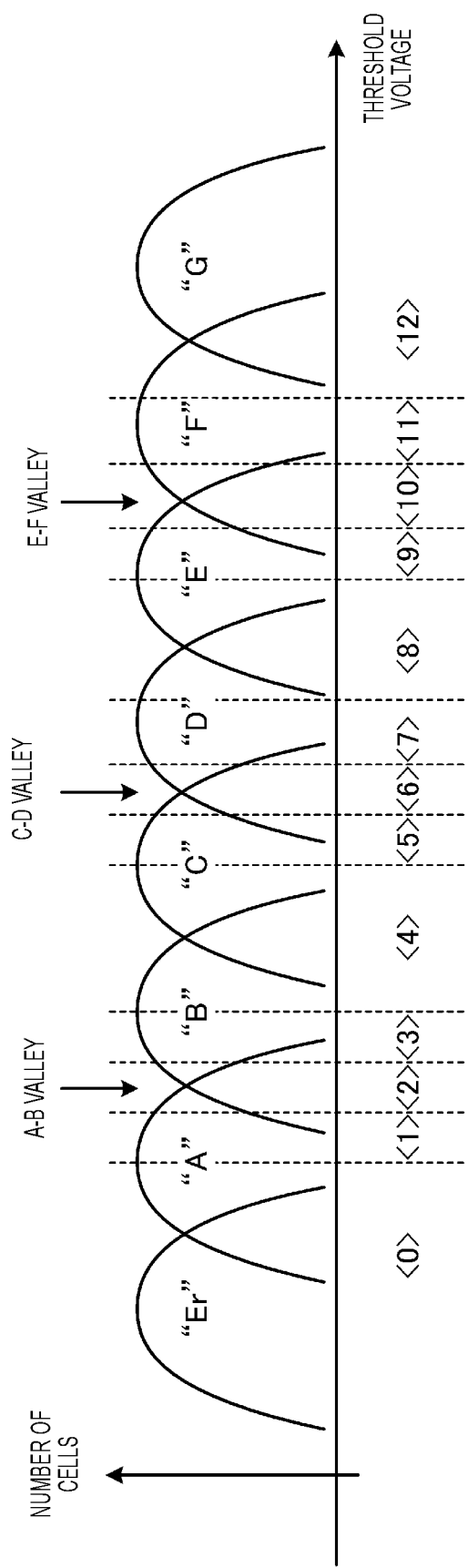
FIG. 10 is a diagram to explain a method for creating a label column.

FIG. 10 is a diagram to explain a method for creating the label column. FIG. 10 illustrates an example of a case where the middle page is read in the same manner as in FIG. 9. For the middle page, read voltages at four points are specified with respect to each of three valleys (A-B valley, C-D valley, and E-F valley). That is, read voltages at a total of 12 points are specified. Further, a total of 13 ranges of the read voltage is obtained by the read voltages at 12 points. The encoding/decoding unit 14 creates 13 labels <0> to <12> that indicate the 13 ranges of the read voltage, respectively.

Since the number of valleys in the lower page and the upper page is two, the read voltages are specified at eight points, and the number of the created labels is nine (e.g., <0> to <8>).

Returning to FIG. 9, the encoding/decoding unit 14 calculates the value of the LLR corresponding to the label, which corresponds to the read data, with reference to the LLR table (step S209), and performs soft bit decoding with the column of the calculated LLR (LLR column) as an input (step S210).

As described above, when the track process involving the deviation amount is performed, the memory system 1 performs the decoding process according to the deviation amount. In this case, a plurality of LLR tables defined for each valley, and for each deviation amount is used. For example, when the deviation amount may take 16 values of 0 to 15, 16 LLR tables are prepared for each valley, and the LLR table according to the deviation amount is selected and used.

LLR tables 901 to 903 in FIG. 9 are LLR tables defined for the A-B valley, the C-D valley, and the E-F valley, respectively. For example, for the A-B valley, 16 LLR tables 901, in which the LLRs ($A_0, A_1, A_2, A_3$, and $A_4$) for each of the five labels <0> to <4> are defined, are prepared. For example, for the C-D valley, 16 LLR tables 902, in which the LLRs ($C_0, C_1, C_2, C_3$, and $C_4$) for each of the five labels <4> to <8> are defined, are prepared. For example, for the E-F valley, 16 LLR tables 903, in which the LLRs ($E_0, E_1, E_2, E_3$, and $E_4$) for each of the five labels <8> to <12> are defined, are prepared.

FIG. 11 is a table illustrating an example of a data structure of the LLR table. FIG. 11 illustrates an example of the LLR table 901 corresponding to the A-B valley. In the LLR table 901 in FIG. 11, the values of the LLRs with respect to the deviation amount of 16 values are collectively illustrated in the form of one table. The 16 LLR tables may be separately provided in the form of a collection of individual tables.

Returning to FIG. 9, the encoding/decoding unit 14 selects one LLR table according to the deviation amount for each valley. For the A-B valley, the encoding/decoding unit 14 selects an LLR table from the 16 LLR tables 901 according to the corresponding deviation amount (step S205). For the C-D valley, the encoding/decoding unit 14 selects an LLR table from the 16 LLR tables 902 according to the corresponding deviation amount (step S206). For the E-F valley, the encoding/decoding unit 14 selects an LLR table from the 16 LLR tables 903 according to the corresponding deviation amount (step S207).

The encoding/decoding unit 14 reconstructs a plurality of LLR tables selected for the plurality of valleys into one LLR table (step S208). For example, in the reading of the middle page, the encoding/decoding unit 14 integrates the LLRs ($A_0$, $A_1$, $A_2$, $A_3$, and $A_4$) of the labels <0> to <4> corresponding to the A-B valley, the LLRs ($C_0$, $C_1$, $C_2$, $C_3$, and $C_4$) of the labels <4> to <8> corresponding to the C-D valley, and the LLRs ($E_0$, $E_1$, $E_2$, $E_3$, and $E_4$) of the labels <8> to <12> corresponding to the E-F valley, and reconstructs one LLR table that defines 13 LLRs ($X_0$, $X_1$, $X_2$, $X_3$, $X_4$, $X_5$, $X_6$, $X_7$, $X_8$, $X_9$, $X_{10}$, $X_{11}$, and $X_{12}$) corresponding to the 13 labels <0> to <12>.

The LLR for the same label may be different from each other depending on the valley. In this case, the LLR of some valleys may be used, or an average value of the values of a plurality of LLRs may be used. Further, when the track process not involving the deviation between the optimum read voltage and the shift read voltage is performed, the process of selecting the LLR table according to the deviation amount is not necessary.

Returning to FIG. 9, the encoding/decoding unit 14 calculates the values of the LLR with reference to the LLR table reconstructed in this manner (step S209), and performs soft bit decoding having the calculated LLR column as an input (step S210).

The LLR table according to the deviation amount for each valley is created by measuring using the memory system 1, or by simulation, for example, before a product is shipped. In the following, an example of a method for creating the LLR table will be described.

The LLR table is created by, for example, an information processing device such as the host 30 connected to the memory system 1. The information processing device calculates the LLR for each valley and for each label, for example, according to an equation (1) below.

$$LLR = \lambda \times \ln(p(1)/p(0)) \quad (1)$$

$p(1)$ is a probability of 1 for the label. $p(0)$ is a probability of 0 for the label. $\lambda$ is an integer. Each probability is calculated from, for example, the count value of the value (0 or 1) written in the memory cell corresponding to the label, and the count value of the read data (0 or 1) read from the memory cell.

Figure 12:
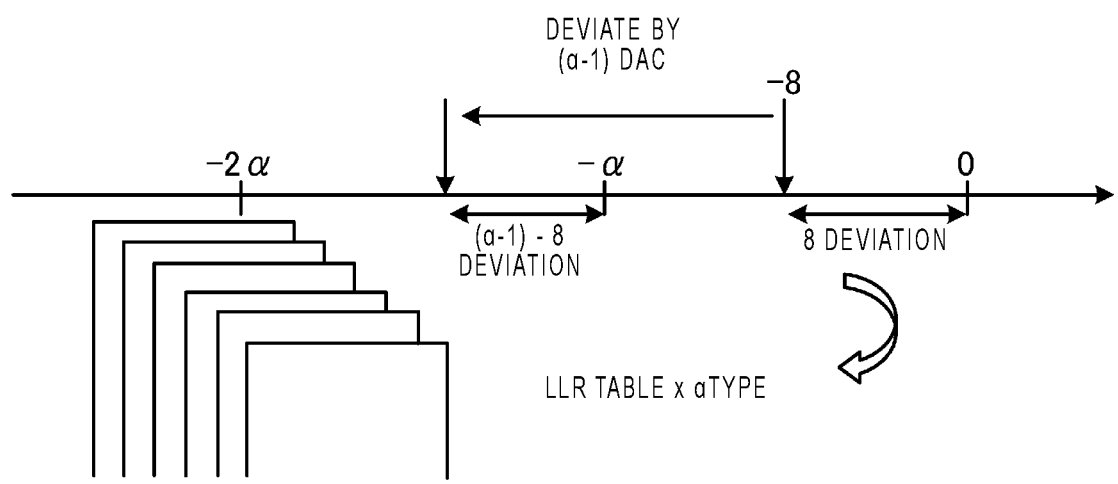
FIG. 12 is a diagram illustrating an example of an order of creating an LLR table.

FIG. 12 is a diagram illustrating an example of an order of creating the LLR table. The coordinate axis in FIG. 12 indicates the deviation amount from the shift read voltage. 0 corresponds to the shift read voltage. FIG. 12 illustrates an example of a case where the optimum read voltage is shift read voltage–8DAC value (deviation amount=8DAC)). In this case, the information processing device creates the LLR table for the deviation amount of 8.

The LLR table for other deviation amounts may be further created by using the non-volatile memory 20 at the time of creating the LLR table for the deviation amount of 8. For example, when the LLR table for the deviation amount of 8DAC is created, the information device performs reading using the shift read voltage that deviates by 1DAC step until the deviation amount corresponds to ($\alpha$−1)DAC, and obtains the read data. The information processing device creates the LLR table for the deviation amount by the above equation (1), using the read data by the shift read voltage corresponding to each deviation amount.

In the example in FIG. 12, the read data according to the deviation from −9DAC to −($\alpha$+7)DAC is obtained. With the read data, the LLR table of the deviation amount of 9DAC to the LLR table of the deviation amount of ($\alpha$−1)DAC, and the LLR table of the deviation amount of 0DAC to the LLR table of the deviation amount of 7DAC are further created.

[Modification 1]

The method for creating the LLR table is not limited to the above method. For example, the information processing device may create the LLR table of other deviation amounts (e.g., deviation amount of 1DAC to $\alpha$DAC), by arithmetic using the value of each LLR of the LLR table created for a certain deviation amount (e.g., deviation amount of 0DAC).

[Modification 2]

The soft bit decoding may be performable in parallel. For example, the memory system 1 may be configured such that the soft bit decoding in step S210 in FIG. 9 is performed in parallel by a plurality of circuits. As a result, the soft bit decoding may be performed in parallel on a plurality of LLR columns obtained from a plurality of LLR tables. As a result, it is possible to speed up the decoding process. The plurality of LLR tables may be, for example, the LLR table for each valley.

As the decoding process to which the track process is applied, there is a technique in which the optimum read voltage is obtained by the track process, and then the shift read is further performed using the obtained optimum read voltage. In this technique, since the shift read is performed again after the track process, the speed of the decoding process may be slow. In contrast, according to the above embodiment, the soft bit decoding is performed by re-using the read data obtained through the track process. As a result, an additional shift read or the like becomes unnecessary, and the speed of the decoding process can be improved.

Further, even when there is a deviation amounts between the optimum read voltage obtained in the track process and the shift read voltage, a plurality of LLR tables according to the deviation amount may be used. As a result, the accuracy of the error correction can be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:
   a nonvolatile memory including a plurality of memory cells; and
   a memory controller configured to:
      read first data through application of a first read voltage to each of the memory cells;
      perform a first decoding process with respect to the first data;
      when the first decoding process fails, perform a tracking process by:
         reading second data indicating a threshold voltage level of each of the memory cells through application of a plurality of second read voltages to each of the memory cells, the second read voltages being shifted by a predetermined amount; and
         obtaining, with respect to each of the memory cells, likelihood information indicating a likelihood that the memory cell in the threshold voltage level represents a bit value of 0 or 1 using the second data; and
      perform a second decoding process with respect to the second data using the likelihood information.

2. The memory system according to claim 1, wherein the memory controller is configured to, during the tracking process:
  generate, based on the second data, a histogram corresponding to the first read voltage, the histogram indicating a threshold voltage distribution of the memory cells;
  estimate an optimum first read voltage based on a valley of the histogram;
  determine a difference between each of the second read voltages and the optimum first read voltage; and
  obtain the likelihood information also using the determined difference.

3. The memory system according to claim 2, wherein
  a likelihood table indicating a relationship between the difference and the likelihood with respect each of a plurality of threshold voltage levels is stored in the memory system, and
  the memory controller is configured to obtain the likelihood information by referring to the likelihood table using the second data and the difference.

4. The memory system according to claim 3, wherein
  the first read voltage is one of a plurality of first read voltages corresponding to multi-bit data storage in each of the memory cells,
  a plurality of likelihood tables corresponding to the first read voltages, respectively, are stored in the memory system.

5. The memory system according to claim 4, wherein the memory controller is further configured to consolidate the plurality of likelihood tables into a single likelihood table.

6. The memory system according to claim 3, wherein
  the difference in the likelihood table is incremental by a first amount, and
  the predetermined amount is a second amount greater than the first amount.

7. The memory system according to claim 2, wherein
  a number of the second read voltages is a first number,
  the memory controller is configured to, during the tracking process, select a second number of second read voltages based on proximity to the optimum first read voltage, the second number being less than the first number, and
  the second data is data read from the memory cells using the second number of second read voltages.

8. The memory system according to claim 1, wherein the memory controller is further configured to update the first read voltage to the optimum first read voltage estimated during the tracking process.

9. The memory system according to claim 1, wherein
  the first decoding process is a hard decision decoding process, and
  the second decoding process is a soft decision decoding process.

10. The memory system according to claim 1, wherein the memory controller is configured to perform the second decoding process in parallel with respect to multiple memory cells.

11. A method for controlling a memory system having a nonvolatile memory including a plurality of memory cells, the method comprising:
  reading first data through application of a first read voltage to each of the memory cells;
  performing a first decoding process with respect to the first data;
  when the first decoding process fails, performing a tracking process by:
    reading second data indicating a threshold voltage level of each of the memory cells through application of a plurality of second read voltages to each of the memory cells, the second read voltages being shifted by a predetermined amount; and
    obtaining, with respect to each of the memory cells, likelihood information indicating a likelihood that the memory cell in the second threshold voltage level represents a bit value of 0 or 1 using the second data; and
  performing a second decoding process with respect to the second data using the likelihood information.

12. The method according to claim 11, wherein the tracking process further comprises:
  generating, based on the second data, a histogram corresponding to the first read voltage, the histogram indicating a threshold voltage distribution of the memory cells;
  estimating an optimum first read voltage based on a valley of the histogram;
  determining a difference between each of the second read voltages and the optimum first read voltage; and
  obtaining the likelihood information also using the determined difference.

13. The method according to claim 12, further comprises:
  storing a likelihood table indicating a relationship between the difference and the likelihood with respect each of a plurality of threshold voltages levels is stored in the memory system, wherein
  the likelihood information is obtained by referring to the likelihood table using the second data and the difference.

14. The method according to claim 13, wherein
  the first read voltage is one of a plurality of first read voltages corresponding to multi-bit data storage in each of the memory cells,
  and the method further comprises storing a plurality of likelihood tables corresponding to the first read voltages, respectively.

15. The method according to claim 14, further comprises:
  consolidating the plurality of likelihood tables into a single likelihood table.

16. The method according to claim 13, wherein
  the difference in the likelihood table is incremental by a first amount, and
  the predetermined amount is a second amount greater than the first amount.

17. The method according to claim 12, wherein
  a number of the second read voltages is a first number,
  the tracking process further comprises selecting a second number of second read voltages based on proximity to the optimum first read voltage, the second number being less than the first number, and
  the second data is data read from the memory cells using the second number of second read voltages.

18. The method according to claim 11, further comprises:
  updating the first read voltage to the optimum first read voltage estimated during the tracking process.

19. The method according to claim 11, wherein
the first decoding process is a hard decision decoding process, and
the second decoding process is a soft decision decoding process.

20. The method according to claim 11, wherein the second decoding process is performed in parallel with respect to multiple memory cells.

* * * * *